United States Patent
Williams et al.

Patent Number: 5,365,241
Date of Patent: Nov. 15, 1994

[54] METHOD AND APPARATUS FOR PERFORMING PLANAR NEAR-FIELD ANTENNA MEASUREMENT USING BI-POLAR GEOMETRY

[76] Inventors: Lawrence I. S. Williams, 1401 Puente St., Brea, Calif. 92621; Yahya Rahmat-Samii, 4509 Tobias Ave., Sherman Oaks, Calif. 91403

[21] Appl. No.: 903,366

[22] Filed: Jun. 24, 1992

[51] Int. Cl.$^5$ .............................. G01R 29/10
[52] U.S. Cl. .................... 343/703; 455/67.1
[58] Field of Search .......... 343/703, 766; 342/360; 324/95, 106; 455/67.1, 726.1

[56] References Cited

U.S. PATENT DOCUMENTS 4,201,987 5/1980 Tricoles et al. ............ 343/703
5,119,105 6/1992 Ngai et al. .................. 343/703

FOREIGN PATENT DOCUMENTS 0120678 5/1990 Japan ......................... 343/703

Primary Examiner—Donald Hajec
Assistant Examiner—Tan Ho
Attorney, Agent, or Firm—Cislo & Thomas

[57] ABSTRACT

A planar near-field antenna measurement and diagnostic system is described which collects data on a bi-polar grid. The planar scanning is accomplished using rotary positioners and a mechanical arm. The test antenna is mounted to a rotary positioner such that it can spin about its axis. The arm is mounted to another rotary positioner such that it can rotate about a second axis. A field probe, attached to the end of the arm, scribes an arc which passes through the antenna rotation axis. By rotating the two positioners, the near-field of the antenna can be measured on a bi-polar sampling grid comprising concentric circles and radial arcs. The mechanical simplicity afforded by rotational motion rather than the linear motion of most planar near-field scanners provides for an elegant and cost-effective design.

1 Claim, 6 Drawing Sheets

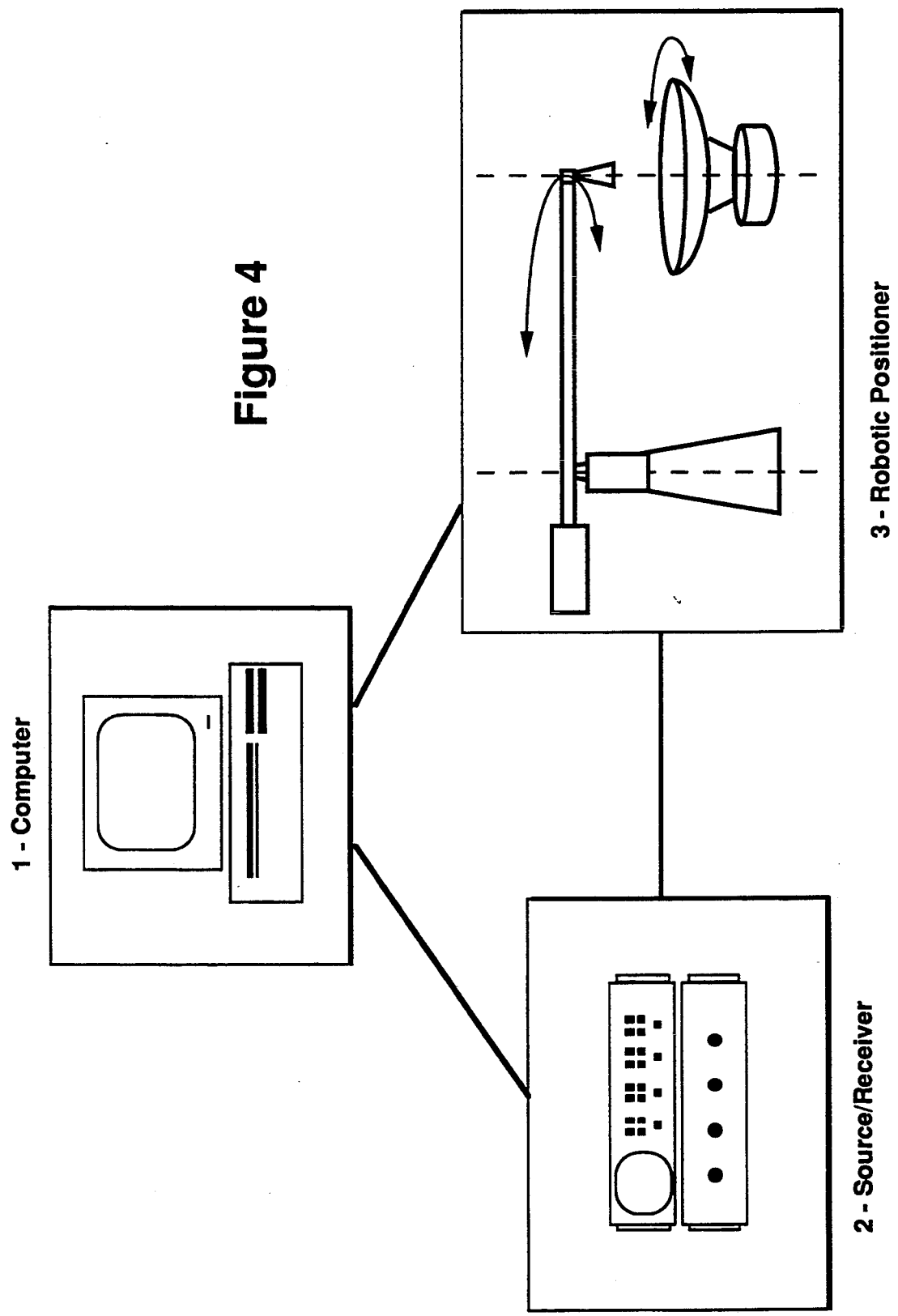

METHOD AND APPARATUS FOR PERFORMING PLANAR NEAR-FIELD ANTENNA MEASUREMENT USING BI-POLAR GEOMETRY

BACKGROUND OF THE INVENTION

1. Field of the Invention

This invention relates to the measurement of the radiation characteristics of microwave and millimeter-wave antennas, and more particularly to a near-field measurement system which measures the radiating near-field of the antenna under test (AUT) on a planar bi-polar data collection grid.

2. Description of the Related Art

Much attention has been given to the process of measuring the radiating near-field of microwave antennas as a means to determine the far-field radiation pattern and to perform antenna diagnostics. In a typical near-field antenna measurement system the field (both amplitude and phase) of the AUT is measured with a field probe over a virtual surface. This data is then transformed to the far-field antenna radiation pattern by computer processing to evaluate antenna performance. Alternatively, the near-field data may be transformed back toward the AUT to provide information about the aperture fields and to perform antenna diagnostics.

A typical near-field measurement range consists of three primary subsystems: a computer, a robotic positioner and a microwave source/receiver. The computer provides the user interface and controls the positioner and source/receiver. In addition it commands the robotic positioner which moves the test antenna, a field probe, or both over the desired virtual surface. The microwave subsystem measures the amplitude and phase of the fields surrounding the antenna during this scanning process. Reciprocity considerations allow either the probe or AUT to transmit.

The type of near-field scanner is determined by the measurement surface scanned by the field probe. Realizable surfaces include planes, circular cylinders and spheres which correspond to three major near-field scanning systems: planar, cylindrical and spherical. These systems each have certain advantages depending upon the antenna to be measured. The simplest and most common scanning systems are of the planar type. When using the planar method, it is assumed that the AUT radiates predominantly in a single direction and, therefore, planar scanners are popular for the measurement of reflector antennas and planar arrays. The near-field to far-field transformation is a simple two-dimensional Fourier transform of the near-field data. This transform is calculated by computer, often using a fast Fourier transform (FFT) algorithm. The field is typically sampled every half wavelength to satisfy the Nyquist sampling criteria. An excellent review of current near-field measurement technology can be found in the special issue of the Institute of Electrical and Electronics Engineers, Antennas and Propagation Journal, volume AP-36, Jun. 1988.

In the past, planar near-field scanners were categorized as being either plane-rectangular or plane-polar. For the plane-rectangular case, the probe is typically driven linearly in a raster scan over a plane in front of the antenna. The raster scan causes the measurement points to lie on a rectangular grid. The plane-polar approach typically uses a linearly scanning probe over a rotating AUT. For the plane-polar technique, data is collected on concentric rings centered at the middle of the scan plane. The linear motion of the probe causes the measurement points to lie on radial lines.

The above mentioned planar near-field measurement systems, namely plane-rectangular and plane-polar, both require the mechanical positioning of the probe along linear paths. The present invention is a planar near-field scanner which offers another approach requiring only rotational mechanical motion. The mechanical implementation of rotational motion is typically simpler than linear motion, and due to this simplicity the cost of implementing the bi-polar near-field scanner is reduced.

SUMMARY OF THE INVENTION

The requirement of any planar near-field system is to measure the electromagnetic fields radiating from a test antenna on a planar surface. The data collection grid on this planar surface depends upon the mechanical configuration of the robotic positioner. The present invention is a planar near-field measurement scanner consisting a rotating antenna platform, a rotating counter-balanced arm, base frame and field probe rotator/translator. The main feature of this near-field scanner is its mechanical simplicity. Measurement on a plane is accomplished using a sweeping motion of the counter-balanced arm and rotation of the AUT. The mechanical motions required for the arm and the AUT are purely rotational. In contrast, the prior art plane-rectangular and plane-polar near-field scanners require linear mechanical motion. Since linear mechanical motion is typically more entailed and more expensive than rotational mechanical motion, this invention has the distinct advantage of costing less to implement while having fewer moving parts to wear out.

This invention is similar to plane-polar scanning since the antenna rotates about its axis. For this case, however, the probe no longer moves linearly. Instead the probe is fixed to a mechanical arm placed in front of the antenna. This arm is free to rotate about a second axis parallel to the antenna rotation axis. There is a polar coordinate system defined about the rotating AUT and another polar coordinate system defined about the rotating arm hence the name bi-polar. The arm is configured such that the probe scribes an arc which passes through the antenna axis. With this configuration, the data is collected on concentric rings with data points located on radial arcs. The combination of antenna rotation and arm rotation yields the desired planar coverage. The probe is mounted to the end of the arm on another, smaller, rotary positioner to enable co-rotation with the AUT. The probe rotator is used to counter-rotate the probe as the arm is rotated away from the center of the scan plane. It also can be used to co-rotate with the AUT to maintain proper polarization if desired. Co-rotation of the probe is not always necessary, but is an important feature especially for probes that do not exhibit first order azimuthal dependance. Probes of this type must be co-rotated in order to perform the data processing.

The main feature of the bi-polar scanner is its mechanical simplicity. Both plane-polar and conventional plane-rectangular scanning require linear probe motion. Linear motion is typically accomplished using a pair of rails with linear reciprocating bearings mounted to a stage. The linear bearings glide along the rails as the stage is propelled by a ball screw drive. The rails must have little runout in order to avoid positionally induced phase error and to ensure a truly planar scan surface. The maximum travel of the linear motion is determined by the length of the linear rails, therefore, a large scan plane requires long linear rails and a large support structure. The size, weight and cost for a near-field scanner rapidly increases as the scan plane size is increased.

The bi-polar scanner only requires rotational motion. The mechanical implementation of rotational motion is typically simpler than linear motion. All that is required is a conventional rotary bearing and perhaps a gear drive system thus reducing the cost of implementation. The maximum size of the scan plane is determined by the length of the bi-polar arm and the maximum sweep angle of the arm rather than the physical size of the near-field scanner and its support mechanism. The bi-polar arm eliminates the linear motion hardware since only a rotary motion is required. The mechanical simplicity makes for a reliable and reduced cost measurement system. The length of the arm determines the maximum scan plane radius; the arm's rigidity and bearing quality determines the planar accuracy of the scan.

For a given sized scan plane, the bi-polar near-field scanner is quite compact especially when compared with a plane-rectangular scanner. For example, a plane-rectangular scanner capable of a ten foot by ten foot scan requires, at a minimum, a structure that is ten feet by ten feet in size. In contrast, similar coverage can be achieved with a bi-polar scanner with an arm that is less than five feet long. The five foot arm scanned to 60 degrees yields a scan plane with a ten foot diameter. The entire scanner support mechanism only needs to be slightly larger than the arm and, therefore, the bi-polar scanner can be half the physical size of the plane-rectangular scanner.

The AUT axis and the arm axis of the bi-polar scanner must be co-aligned in order to perform accurate measurements. Without co-alignment the data points will not lie on a known measurement grid nor will they lie on a plane. The algorithm used in the data processing is based upon a planar measurement surface and therefore co-alignment is required. The bi-polar near-field scanner as implemented in this invention uses a rigid base frame to maintain the alignment. The advantage of using such a base frame is especially apparent when performing measurements on antennas which have a center of mass which does not coincide with the rotation axis. As the AUT rotates, it may deflect the rotary platform causing the two rotary axes to become misaligned. With the rigid base frame, any deflection of the rotary platform will cause the entire apparatus to deflect (including the arm axis) and thus will cause no misalignment. For similar reasons the arm is counterbalanced by a large weight. This weight can be repositioned along the arm to balance the weight of the probe and probe rotator.

The bi-polar range exhibits multiple functionality. Like the plane-polar range, bi-polar requires a rotating platform. Whenever the range is not being used to make near-field measurements, the rotating platform can be used to rotate a test antenna to make conventional far-field measurements for small antennas.

Another feature of the bi-polar scanner is the ease of mounting the RF cables which attach the probe to the RF source/receiver. These cables must be high-quality, phase-stable cables in order to avoid measurement errors as the probe moves. Due to their delicate nature it is important to support them carefully. For the bi-polar scanner, the cables can simply be run along the top of the arm and then back to the RF source/receiver. In contrast, the plane-rectangular and plane-polar scanners have no simple means to support the RF cables owing to the linear translation of the probe. The cables are typically dangled from the probe to the floor or ceiling of the measurement chamber or are supported by some additional hardware.

These and other features which are considered to be characteristic of this invention are set forth with particularity in the appended claims. The invention itself, however, as well as additional objects and advantages thereof, will best be understood in the following description when considered in conjunction with the accompanying drawings.

BRIEF DESCRIPTION OF THE DRAWINGS

FIG. 1b is a data collection grid of the plane-rectangular near-field scanning geometry of FIG. 1a;

FIG. 2b is a data collection grid of the conventional prior art plane-polar scanning geometry of FIG. 2a;

FIG. 3b is a data collection grid of the bi-polar near-field scanning geometry of FIG. 3a;

FIG. 4 is a schematic drawing of a typical planar near-field measurement system displaying the three major subsystems;

DETAILED DESCRIPTION OF THE PREFERRED EMBODIMENT

Figure 1B:
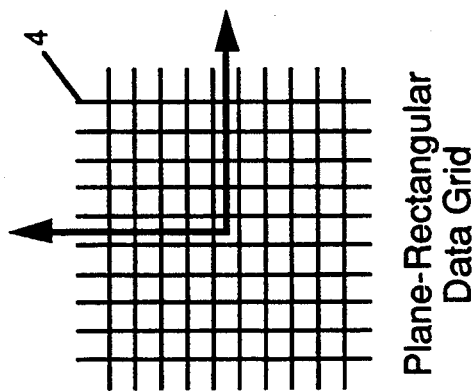
Figure 1A:
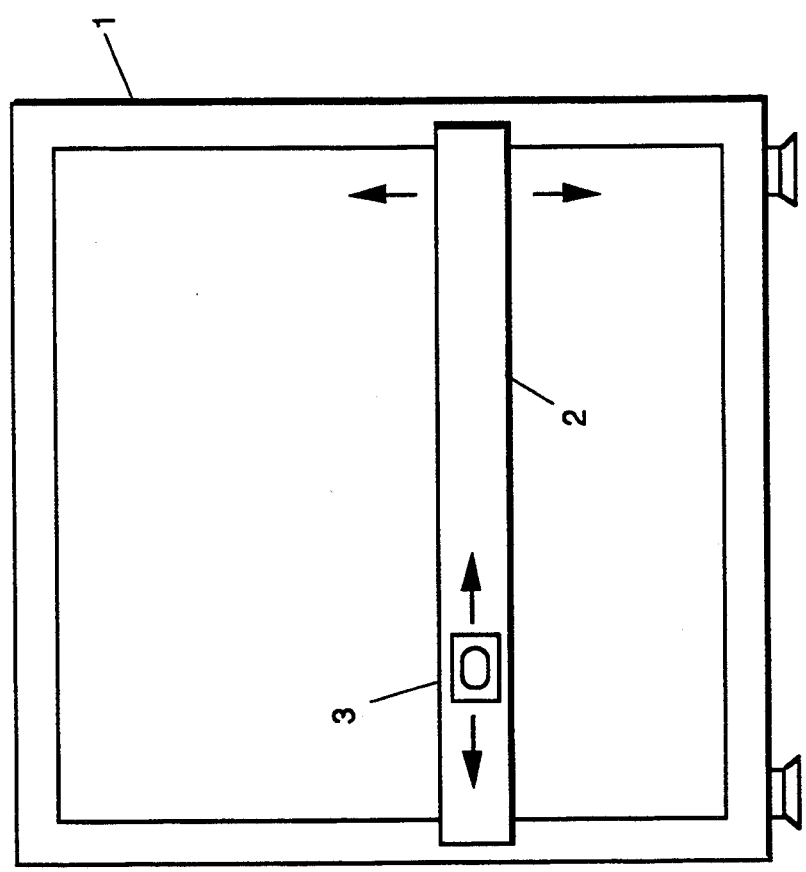
FIG. 1a is a schematic drawing of a conventional prior art plane-rectangular near-field scanning geometry.

In FIGS. 1a and 1b, conventional prior art plane-rectangular near-field scanning geometry and the associated plane-rectangular data collection grid 4 is shown. A scanner frame 1 supports a carriage 2 which can be positioned in the vertical direction. The AUT (not shown in the diagram) is placed directly in front of the scanner frame 1. The field probe 3 is attached to the carriage 2 such that the field probe 3 can be positioned in the horizontal direction. The carriage 2 and the field probe 3 are typically positioned using servomotors or stepper motors controlled by a computer. A typical measurement sequence is for the computer to direct the field probe 3 to one corner of the scanner frame 1, move the field probe 3 in a continuous linear motion in the horizontal direction and collect near-field data at equi-spaced points. When the field probe 3 reaches the opposite side of the frame 1, the carriage 2 is incremented in the vertical direction. The field probe 3 then travels back along the carriage 2 collecting data in the opposite direction. In this fashion, the field probe 3 performs a raster-scan and collects data on a plane-rectangular grid 4.

Figure 2B:
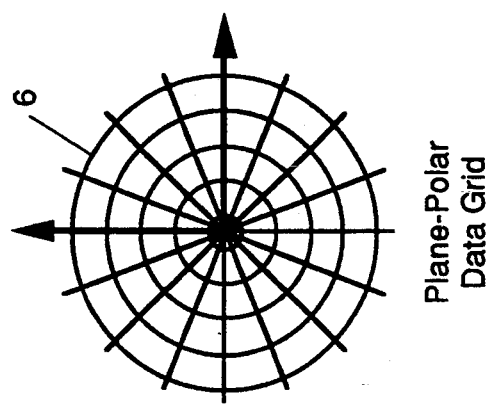
Figure 2A:
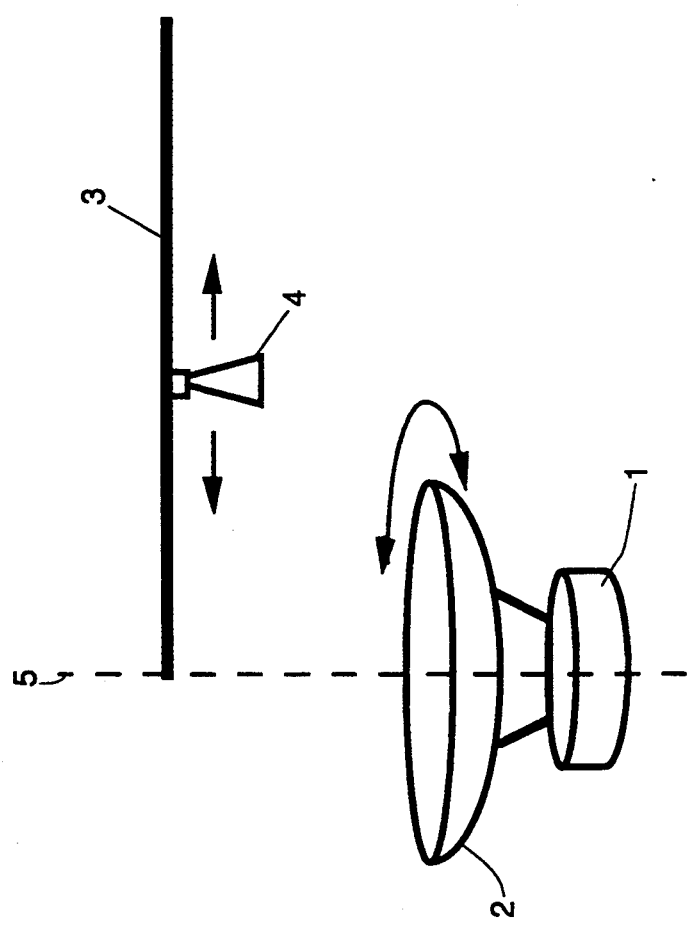
FIG. 2a is a schematic drawing of a conventional prior art plane-polar scanning geometry.

In FIGS. 2a and 2b, conventional prior art plane-polar near-field scanning geometry and the associated plane-polar data collection grid 6 is shown. An antenna rotating platform 1 supports the AUT 2 and a linear rail positioner 3 supports the field probe 4. The rotating platform 1 enables the AUT 2 to be rotated about the platform axis 5. The linear rail positioner 3 enables the field probe 4 to be positioned in the radial direction. The motion of the antenna rotating platform 1 and the field probe 4 along the linear rail positioner 3 is typically performed using servomotors or stepper motors controlled by a computer. A typical measurement sequence is for the computer to command the field probe 4 to the center of the scan plane directly on the axis of the antenna rotating platform 1. The test sequence and processing may not require the center field value and therefore measurements may or may not be performed directly above the AUT 2. The position of the field probe 4 is incremented in the radial direction as afforded by the linear rail positioner 3. The probe 4 is held stationary while the antenna rotating platform 1 is rotated through 360 degrees. During the rotation, the field probe 4 measures the field on a ring, usually in equal increments of the antenna rotating platform 1 rotation angle. After a ring of data is acquired, the field probe 4 position is incremented radially and another ring of data is taken. Continuing this process, the field probe 4 will collect data on a series of concentric rings with data point lying on radial lines. This data collection grid is called the plane-polar grid 6. It is possible to perform the measurement process in some other order such as collecting an entire radial line of data prior to incrementing the AUT 2 position.

Figure 3B:
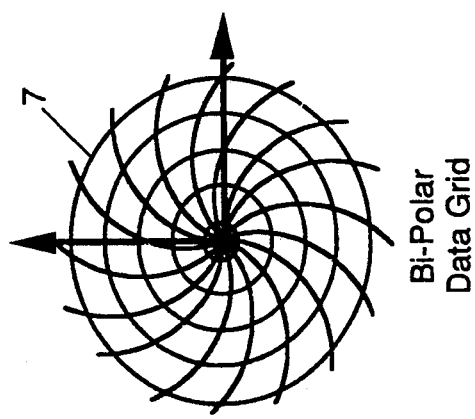
Figure 3A:
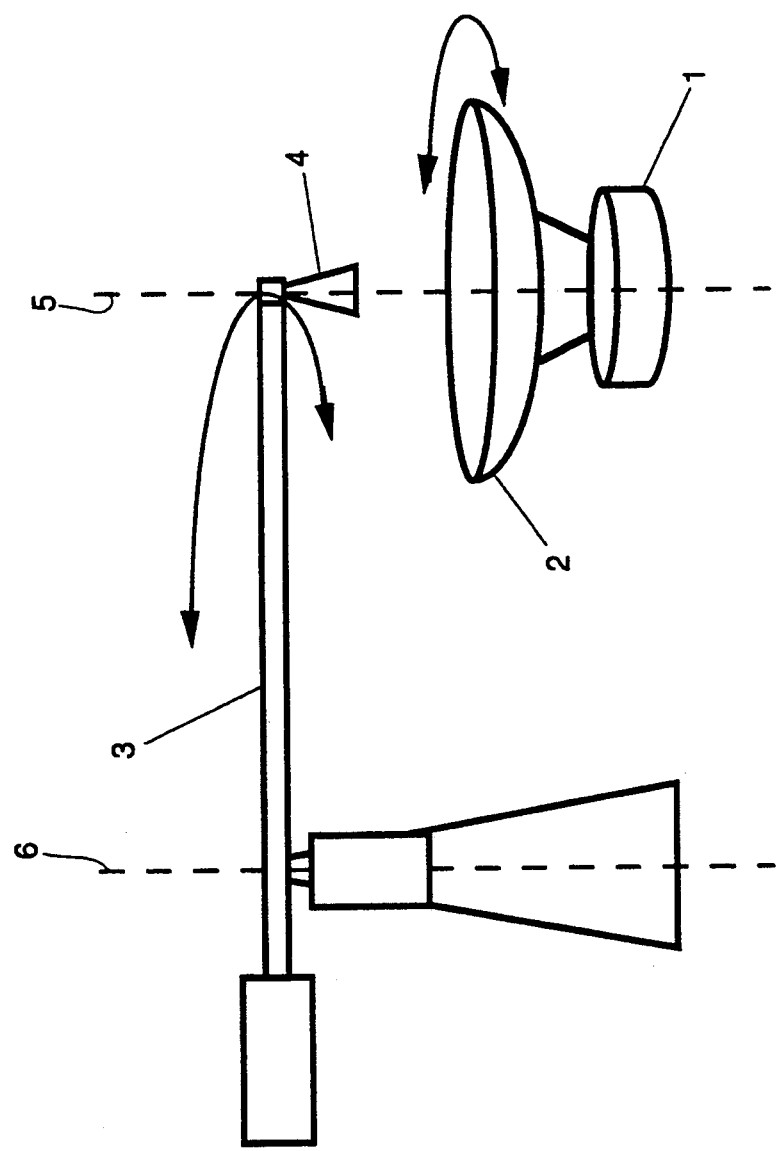
FIG. 3a is a schematic drawing of a bi-polar near-field scanning geometry in accordance with the invention.

In FIGS. 3a and 3b, a bi-polar planar near-field measurement system and the associated bi-polar data collection grid 7 is shown in accordance with the invention. An antenna rotating platform 1 supports the AUT 2 and a counter-weighted arm 3 supports the field probe 4. The rotating platform 1 enables the AUT 2 to be rotated about the rotator axis 5. The counter-weight arm 3 enables the field probe 4 to be positioned along radial arcs by rotating about the arm axis 6. The motion of the antenna rotating platform 1 and the counter-weighted arm 3 is typically performed using servomotors or stepper motors controlled by a computer. A typical measurement sequence is for the computer to command the counter-weighted arm 3 to position the field probe 4 to the center of the scan plane directly above the AUT 2. The test sequence and processing may not require the center field value and therefore measurements may or may not be perforated directly above the AUT 2. The position of the field probe 4 is incremented along a radial arc as afforded by outward rotation of the counter-weighted arm 3. The field probe 4 is then held stationary while the antenna rotating platform 1 is rotated through 360 degrees. During the rotation the field probe 4 measures the field on a ring, usually in equal increments in the antenna rotating platform 1 rotation angle. After a ring of data is acquired, the field probe 4 is incremented along a radial arc by rotating the arm 3 outward. The field probe 4 is then held stationary and another ring of data is taken. Continuing this process, the field probe 4 will collect data on a series of concentric rings with data point lying on radial arcs. This data collection grid is called the bi-polar grid 7. It is possible to perform the measurement process in some other order such as collecting an entire radial arc of data prior to incrementing the AUT 2 position. Additionally, it is possible for the bi-polar scanner to measure on some other grid by suitable computer control. For example, it is possible to measure near-field data on a spiral by continuously rotating the AUT 2 and continuously rotating the counter-weighted arm 3.

FIG. 4 is a schematic drawing of a typical planar near-field measurement system displaying the three major subsystems: the computer 1, the RF source/receiver 2 and the robotic positioner 3. The computer 1 provides the user interface and automates the near-field measurement testing. The RF source/receiver 2 measures the RF coupling between the AUT and the field probe. Since the receive characteristics of passive, linear antennas are identical to the transmit characteristics (reciprocity), either the probe can transmit while the AUT receives or vice versa. The robotic positioner 3 moves the field probe, the AUT, or both the field probe and the AUT such that the radiating near-field of the antenna can be measured over a planar surface. The robotic positioner 3 as shown in FIG. 4 is of the bi-polar type in accordance with this invention, however, the plane-rectangular or plane-polar could have been used. During a typical measurement, the computer subsystem 1 commands the robotic positioner 3 to scan over some pre-described path which traverses a planar region in front of the AUT. At certain increments along this path, the computer 1 commands the RF source/receiver 2 to collect data. Once the entire near-field scan is complete, the computer 1 is used to process the near-field data to find the far-field radiation characteristics of the AUT or to find the aperture fields of the AUT for antenna diagnostics.

Figure 5:
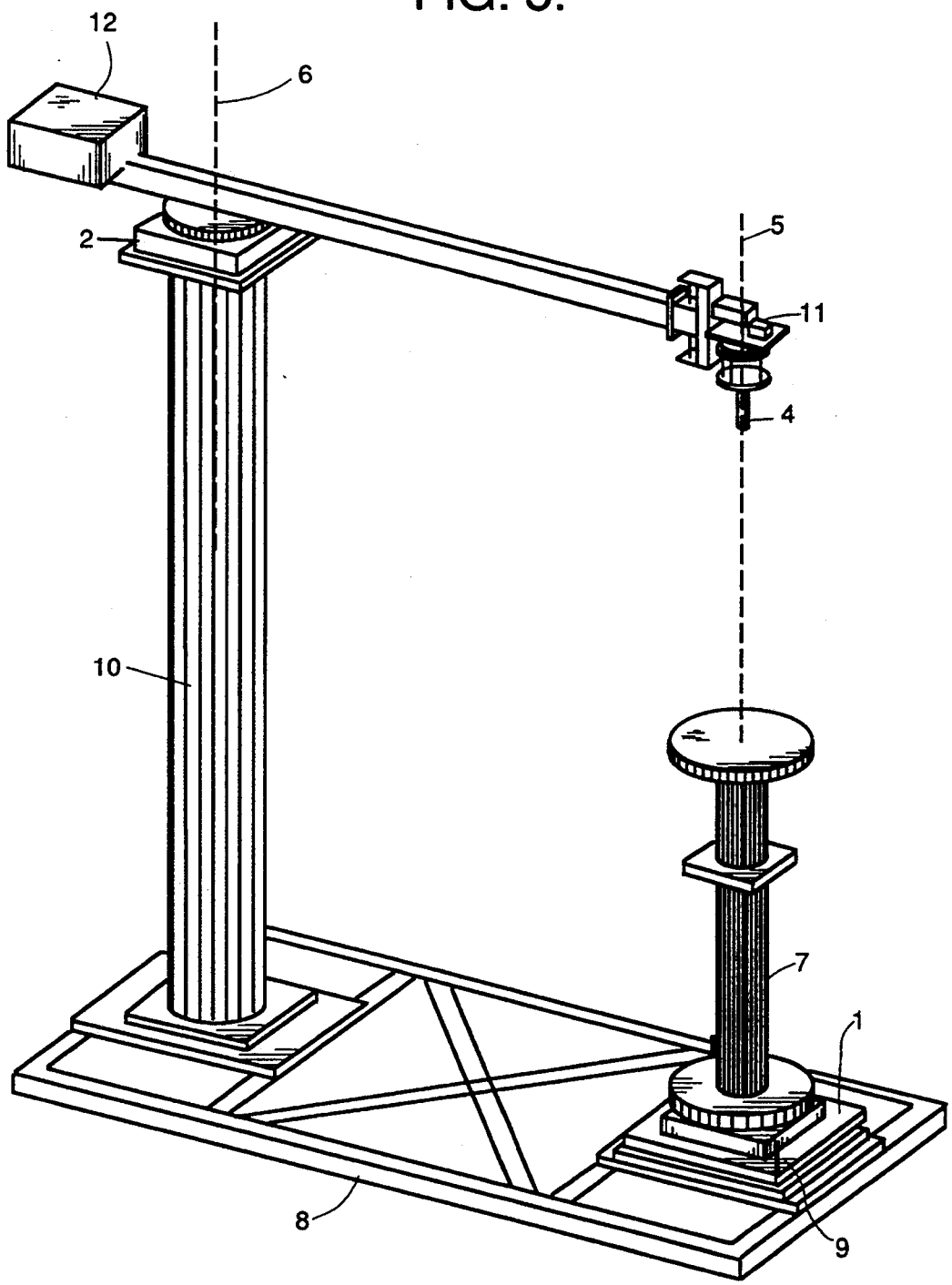
FIG. 5 is a detailed drawing of the bi-polar near-field scanning robotic positioner, as implemented by the inventors, which embodies additional features of the invention.

FIG. 5 is a detailed drawing of the bi-polar near-field scanning robotic positioner, as implemented by the inventors, which embodies additional features of the invention. The two main sources of mechanical motion we provided by the AUT rotary positioner 1 and the arm rotary positioner 2. Each of these positioners are optical bench rotary positioners containing a conventional rotary beating and a tangent worm-drive gear. The arm rotary positioner 2 is attached on top of the arm column 10 which is in turn attached to the rigid base frame 8. The arm rotary positioner 2 rotates the arm 3 providing motion of the field probe 4 along radial arcs. The AUT rotary positioner 1 is attached on top of the AUT rotator tilt platform 9 which is in turn attached to the rigid base frame 8. The AUT rotator tilt platform 9 provides fine adjustment of the alignment of the AUT rotation axis 5 and the arm rotation axis 6. The AUT (not shown in the figure) is attached on top of the telescopic AUT pedestal 7 for the duration of the measurements. The telescopic AUT pedestal 7 is attached to the AUT rotary positioner 1 providing support for the AUT and providing coarse adjustment of the field probe 4 to AUT distance. The field probe 4 is mounted to the probe rotator/translation stage 11 which is in turn mounted at the end of the arm 3. The probe rotator/translation stage 11 provides automated fine adjustment of the field probe 4 to AUT distance. Additionally, the probe rotator/translation stage 11 provides the capability to rotate the field probe 4 on its axis to maintain polarization with the AUT (if desired) and to counter-rotate to compensate for the arm 3 motion. The counter-balance weight 12 is mounted on the arm 3 to balance the weight of the probe rotator/translation stage 11 and the field probe 4. The counter-balance weight 12 serves to reduce stress on the bearings of the arm rotary positioner 2 and helps prevent flexing of the rigid base frame 8 during arm 3 motion.

Figure 6:
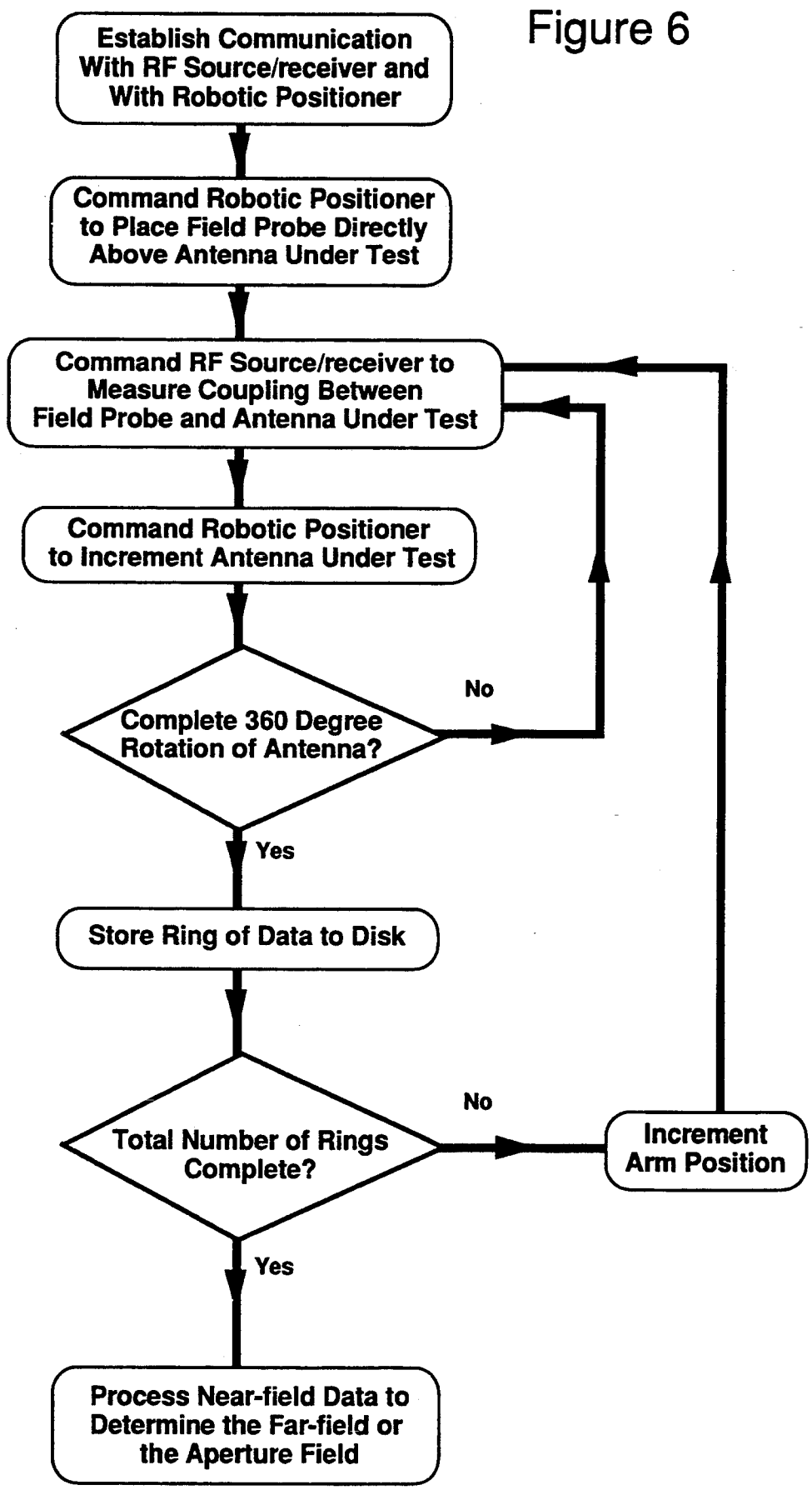
FIG. 6 is a flowchart which describes a computer program to automate a typical measurement sequence using a bi-polar scanner.

FIG. 6 is a flowchart which describes a computer program to automate a typical measurement sequence using a hi-polar scanner. Step 1 is to initialize the entire measurement system by establishing the communication with the RF source/receiver and the robotic positioner. Additionally, measurement parameters such as frequency, averaging and RF power levels will be set in step 1. Step 2 is to place the probe directly over the AUT by commanding the robotic positioner to move the arm. Step 3 is where an actual measurement is performed. Since the probe is directly above the AUT, this first measurement point corresponds to the field amplitude and phase at the center of the measurement plane. This data point may or may not be required by the data processing method. Step 4 moves or rotates the AUT to the next incremental position. There may be 200 such increments to be stepped through about a single ring of data. Step 5 is a conditional process to decide whether an entire ring of data has been acquired. If an entire ring has not been acquired, the program loops over steps 3 and 4 until the AUT has rotated through 360 degrees. Step 6 is then performed such that the ring of data that was buffered in the RF source/receiver is transferred to permanent storage on magnetic disk. Step 7 is a conditional process to decide if the desired scan plane coverage is complete. If the total number of rings has yet to be completed, the program performs step 8 to increment the arm outward to the next ring radius. The program then loops over steps 3 through 7 until the desired near-field plane has been scanned. Once the data has been collected, step 9 is performed to process the near-field data to the far-field or to determine the antenna aperture field.

Many modifications of the present invention are possible in light of the above detailed description. It is therefore to be understood that, in the scope of the appended claims, the invention may be practiced other than as specifically described.

What is claimed is:

1. An apparatus for performing near-field measurements on an antenna comprising:

first positioning means for mounting the antenna and rotating the antenna about a first rotation axis in an azimuthal plane, said first positioning means including a telescopic pedestal attached on top of a rotary positioner, wherein said rotary positioner mounts onto a rotator tilt platform; second positioning means for mounting a field probe thereto in various directions associated with the antenna and moving said field probe along a second rotation axis defining radial arcs, said second positioning means including a robotic positioner, said robotic positioner including a probe rotator/translation stage at an end towards the antenna and a counterbalance weight at an opposite end, said robotic positioner attached on top of an additional rotary positioner, said additional rotary positioner mounted onto an arm column;

wherein said arm column and said rotator tilt platform are mounted together by a rigid base such that said first and second positioning means move relative to each other allowing the antenna or said field probe to receive electromagnetic signals by the other in at least two dimensions;

whereby said field probe is aligned over the antenna by commanding said robotic positioner by a computer and moving the antenna and said field probe by way of a moving step through a predetermined sequence of measurement test points, said moving step comprising the steps of stepping said rotary positioner through a 360 degree azimuthal rotation while stepping said field probe along a radial arc, said two stepping steps being performed in a predetermined sequence, wherein a bi-polar collection grid is mapped out; and whereby a radio frequency source/receiver generates an electromagnetic signal at the antenna or said field probe and received by the other to perform near-field measurements at each measurement test point for storing and subsequent calculation of a near-field to far-field transformation on said near-field measurements.

* * * * *